(12) United States Patent
Cleary

(10) Patent No.: US 6,678,185 B1
(45) Date of Patent: Jan. 13, 2004

(54) PROGRAMMABLE NON-VOLATILE DATA STORAGE CIRCUIT AND A METHOD FOR PROGRAMMING A NON-VOLATILE DATA STORAGE CIRCUIT

(75) Inventor: John Anthony Cleary, Fermoy (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/243,109

(22) Filed: Sep. 13, 2002

(51) Int. Cl.[7] .................................................. G11C 5/06
(52) U.S. Cl. ..................... 365/63; 365/185.05; 365/221; 365/233
(58) Field of Search ..................... 365/63, 221, 185.05, 365/233

(56) References Cited

U.S. PATENT DOCUMENTS

| | | | |
|---|---|---|---|
| 5,353,028 A | | 10/1994 | de Wit et al. |
| 5,384,727 A | | 1/1995 | Moyal et al. |
| 5,532,964 A | * | 7/1996 | Cernea et al. ......... 365/189.09 |
| 5,671,183 A | * | 9/1997 | Soenen et al. ......... 365/189.12 |
| 5,959,926 A | * | 9/1999 | Jones et al. ................. 365/226 |

OTHER PUBLICATIONS de Wit, Michiel, Khen–Sang, Tan, and Hester, Richard K., "A Low–Power 12–b Analog–To–Digital Converter with On–Chip Precision Trimming", IEEE Journal of Solid–State Circuits, vol. 28, No. 4, Apr. 1993, pp. 455–461.

* cited by examiner

Primary Examiner—Michael S. Lebentritt
Assistant Examiner—Pho Luu
(74) Attorney, Agent, or Firm—Wolf, Greenfield & Sacks, P.C.

(57) ABSTRACT

A programmable non-volatile data storage calibration circuit stores a calibration code for a temperature sensor circuit of an IC, comprising a programmable array of addressable bi-state, bi-stable first circuit elements each comprising a fusible resistor. A power supply controlled by a data input signal addresses the first circuit elements to be switched from a first to a second state in the fusible resistor state, the supply, and a clock signal applied to an I/O terminal clocks the data input signal to the interpreter circuit. The interpreter circuit sequentially selects and addresses the first circuit elements and enables switching of the first circuit elements when the supply voltage is at its maximum, blowing a selected fusible resistor. A second, similar circuit element is switched to its second state after programming the calibration circuit to prevent its further programming.

51 Claims, 2 Drawing Sheets

0
PROGRAMMABLE NON-VOLATILE DATA STORAGE CIRCUIT AND A METHOD FOR PROGRAMMING A NON-VOLATILE DATA STORAGE CIRCUIT

FIELD OF THE INVENTION

The present invention relates to a programmable non-volatile data storage circuit, and in particular, though not limited to an on-chip storage circuit for storing a calibration code for an integrated circuit on the chip. The invention also relates to a method for programming a non-volatile data storage circuit and additionally the invention relates to an integrated circuit comprising a primary circuit and a programmable non-volatile data storage circuit comprising a calibration code for the primary circuit of the Integrated circuit.

BACKGROUND OF THE INVENTION

It is known to provide an on-chip calibration circuit on an integrated circuit chip for calibrating the integrated circuit For example, in the case of a temperature sensor and its associated integrated circuit the provision of an on-chip calibration circuit permits the storage of a calibration code for calibrating the integrated circuit. Such calibration circuits comprise an array of bi-state bi-stable circuit elements which are selectively addressable for switching from a first to a second state for programming the calibration circuit in general, in their respective first states each circuit element outputs a logic high, and in its second state outputs a logic low, thus permitting the storing of a calibration code in the calibration circuit Such bi-state bi-stable circuit elements may comprise switchable EEPROM cells, but more typically comprise switchable fuses. In a first state each fuse is in its dosed circuit state and is of relatively low impedance. In its second state each fuse is in an open circuit state with relatively high, and preferably, infinite impedance. The fuse of each circuit element is connected to a voltage derived from the supply voltage to the calibration circuit and to ground through a low value constant current sink. An output from each circuit element is provided through a buffer. In the first state the impedance of the fuse is sufficiently low to pull the output of the corresponding circuit element high, thus providing a logic high output. In the second state the impedance of the fuse is sufficiently high to provide a logic low output from the corresponding circuit element.

There are many ways of blowing fuses in selected circuit elements during programming of such a calibration circuit. One such method comprises laser trimming the fuses. The fuses typically are of gate polysilicon, and a laser is used at the wafer sort stage of the manufacture of an integrated circuit to sever the fuses of selected circuit elements. An alternative method for blowing such fuses is to force a large current to flow through the fuses of selected circuit elements, thereby causing the fuses to blow into an open circuit state. An advantage of blowing the fuses by forcing a large current through the fuses is that it permits trimming of the circuit at a later stage of the production process, and in general, this trimming method permits trimming to be carded out at the in-package stage of an integrated circuit chip production process.

However, a disadvantage of trimming by electrically blowing fuses is that additional pins are required to the calibration circuit for facilitating programming thereof. Typically, a power supply pin and a ground pin are required for powering the calibration circuit, a serial data address pin and a serial clock signal pin are required for selecting and addressing the circuit elements to be switched from their respective first to their second states, and an additional pin is, in general, required for receiving an enable signal for enabling the switching of each circuit element when it has been addressed. Thus, the typical number of pins required for programming a calibration circuit is five, and while the power supply and ground pins may be subsequently used for the integrated circuit after programming of the calibration circuit, even allowing for this, three additional pins may be required, one for each of the serial data addresses and the serial dock signal, and usually one for the enable signal. With the ever increasing requirement to minimise the number of pins on an integrated circuit, this method for programming a calibration circuit is becoming unacceptable. There is therefore a need for a programmable non-volatile data storage circuit which minimises the number of pins or terminals required for programming the circuit.

The present invention is directed towards providing such a circuit, and the invention is also directed towards providing a method for programming such a circuit

SUMMARY OF THE INVENTION

According to the invention there is provided a programmable non-volatile data storage circuit comprising:
 a plurality of selectively addressable first bi-state bi-stable circuit elements, the first circuit elements being electrically switchable from a first state to a second state for programming the storage circuit,
 a first terminal for receiving a power supply modulated with one of a serial data input signal with address data of selected ones of the first circuit elements to be switched from the first state to the second state, and a clock signal for clocking the data input signal,
 a selectively configurable second terminal for receiving the other of the serial data input signal and the clock signal, and
 an interpreter circuit responsive to the data input signal and the clock signal for selecting and addressing each first circuit element to be switched in response to the data input signal, and for enabling switching of each of the selected first circuit elements, and for selectively configuring the second terminal as an input and/or output terminal to operate under the control of a primary circuit with which the data storage circuit is associated, in response to the data input signal.

Preferably, the voltage of the power supply an the first terminal is modulated by the one of the serial data input signal and the dock signal.

Advantageously, the interpreter circuit enables switching of each selected first circuit element when the voltage of the modulated power supply on the first terminal is at a maximum value.

In one embodiment of the invention the interpreter circuit comprises a demodulator for demodulating the modulated voltage of the power supply an the first terminal and for providing the one of the serial data input signal and the clock signal. Preferably, the demodulator comprises a comparator for comparing the voltage of the modulated power supply on the first terminal with a reference voltage, and for outputting the one of the serial data input signal and the clock signal. Advantageously, the reference voltage is selected to lie within the maximum and minimum voltage values of the modulated power supply applied to the comparator. Ideally, the comparator outputs one of a high and low signal in response to the voltage of the modulated power supply applied to the comparator being above the reference voltage, and the comparator outputs the other of the high and low signal in response to the voltage of the modulated power supply applied to the comparator being below the reference voltage.

In one embodiment of the invention the modulated power supply is applied to the comparator through a potential divider.

In another embodiment of the invention the interpreter circuit comprises a state machine for enabling switching of each first circuit element to be switched when the voltage of the modulated power supply is at its maximum value. Preferably, the modulated power supply is applied to each first circuit element when switching of that first circuit element is enabled.

In one embodiment of the invention the interpreter circuit comprises a serial to parallel data interface circuit for converting the serial data input signal to a parallel data signal.

In another embodiment of the invention the first circuit elements are arranged in a matrix comprising a plurality of rows and columns of first circuit elements, and the interpreter circuit comprises an X decoder and a Y decoder for decoding the data signal for selectively addressing each first circuit element by its row and column location, one of the X decoder and the Y decoder being enabled by the state machine for enabling switching of each first circuit element when it is addressed.

Preferably, the second terminal is initially configured as an input terminal for receiving the one of the serial data input signal and the clock signal.

In one embodiment of the invention the second terminal is configurable by the interpreter circuit in response to the data input signal for facilitating reading the status of each first circuit element.

In another embodiment of the invention the second terminal is configurable as an output terminal for outputting a signal from the primary circuit prior to switching of the first circuit elements.

In a still further embodiment of the invention the second terminal is reconfigurable as an input terminal for receiving the one of the serial data input signal and the dock signal until completion of switching of the first circuit elements to be switched in response to the data input signal.

In one embodiment of the invention the second terminal is reconfigurable as an input terminal for receiving the one of the serial data input signal and the clock signal in response to temporary removal of the power supply from the first terminal.

In a further embodiment of the invention the second terminal is configurable by the interpreter circuit to be operable under the control of the primary circuit in response to switching of the first circuit elements to be switched being completed.

In a further embodiment of the invention a second bi-state bi-stable circuit element is provided, the second circuit element being electrically switchable from a first state to a second state for preventing further switching of the first circuit elements, the second circuit element being selectable and addressable by the interpreter circuit in response to the data input signal for switching from the first state to the second state. Preferably, the second circuit element comprises a blowable fuse having a relatively low impedance in a conducting state corresponding to the first state, and a relatively high impedance in a non-conducting state when blown into an open circuit state corresponding to the second state. Advantageously, an addressable switch is provided in the second circuit element, the switch being selectively addressable and being enabled by the interpreter circuit in response to the data input signal for applying the power supply to the fuse for blowing thereof. Ideally, the interpreter circuit is non-responsive to modulation of the power supply on the first terminal after the second circuit element has been switched from the first state to the second state.

In one embodiment of the invention the second circuit element is irreversibly electrically switchable from the first state to the second state.

In another embodiment of the invention each first circuit element comprises a blowable fuse having a relatively low impedance in a conducting state corresponding to the first state, and a relatively high impedance in a non-conducting state when blown into an open circuit state corresponding to the second state.

In one embodiment of the invention an addressable switch is provided in each first circuit element the switch of each first circuit element being selectively addressable and being enabled by the interpreter circuit in response to the data input signal for applying the power supply to the fuse for blowing thereof.

In another embodiment of the invention each first circuit element is irreversibly electrically switchable from the first state to the second state.

In a further embodiment of the invention the first circuit elements are sequentially selectable for switching by the interpreter circuit.

In one embodiment of the invention the first terminal is adapted for receiving the power supply modulated with the serial data input signal, and the second terminal is adapted for receiving the clock signal for clocking the data input signal to the interpreter circuit.

The invention also provides an integrated circuit comprising a primary circuit, and the programmable non-volatile data storage circuit according to the invention for storing a calibration code for the primary circuit, the first terminal providing the power supply to the primary circuit, and the second terminal being selectively configurable to be operable under the control of the primary circuit in response to the data input signal.

Additionally, the invention provides a method for programming a non-volatile data storage circuit comprising a plurality of selectively addressable first bi-state bi-stable circuit elements, the first circuit elements being electrically switchable from a first state to a second state for programming the data storage circuit, the method comprising the steps of:

applying a power supply to the data storage circuit through a first terminal thereof, and modulating the power supply with one of a serial data input signal with address data of selected ones of the first circuit elements to be switched from the first state to the second state, and a dock signal for docking the data input signal, applying the other of the serial data input signal and the clock signal to a selectively configurable second terminal thereof, reading the data input signal, selecting and addressing each circuit element to be switched in response to the data input signal and enabling switching of each selected circuit element, and selectively configuring the second terminal in response to the data input signal as an input and/or output terminal to operate under the control of a primary circuit with which the data storage circuit is associated.

Preferably, the voltage of the power supply on the first terminal is modulated by the one of the serial data input signal and the clock signal.

Advantageously, switching of each selected first circuit element is enabled when the voltage of the modulated power supply on the first terminal is at a maximum value. Ideally, the voltage of the power supply on the first terminal is demodulated for providing the one of the serial data input signal and the clock signal.

In one embodiment of the invention the power supply on the first terminal is modulated with the serial data input signal, and the dock signal is applied to the second terminal.

Further the invention provides a method for operating an integrated circuit comprising a primary circuit, and the programmable non-volatile data storage circuit according to the invention for storing a calibration code for the primary circuit, the method comprising the steps of calibrating the primary circuit by storing a calibration code in the data storage circuit, the calibration code being stored in the data storage circuit by modulating the power supply to the first terminal with one of a serial data input signal with address data of selective ones of the first circuit elements to be switched from the first state to the second state in order to store the calibration code, and a clock signal for docking the data input signal, and applying the other of the serial data input signal and the dock signal to the second terminal of the data storage circuit reading the data input signal, selecting and addressing the first circuit elements to be switched from the first state to the second state and enabling switching of the addressed first circuit elements, configuring the second terminal in response to the data input signal as an input and/or output terminal operable under the control of the primary circuit and powering the primary circuit through the first terminal.

Preferably, the second terminal is configured as an input and/or output terminal operable under the control of the primary circuit in response to storage of the calibration code in the data storage circuit having been completed.

Advantages of the Invention

The advantages of the invention are many. The principal advantage of the invention is that it provides a programmable non-volatile data storage circuit in which the number of terminals required to address the circuit is minimised. Only three terminals are required for powering and programming the circuit, namely, the first terminal, which is the power supply terminal for powering the data storage circuit and through which either the address data in the form of a serial digital data input signal or the clock signal is inputted by modulating the power supply, a second terminal for receiving the other of the serial data input signal and the dock signal, and a ground terminal. A particularly advantageous construction of the data storage circuit is provided when the power supply on the first terminal is modulated with the serial data input signal, and the clock signal is applied to the second terminal. In particular, the programmable non-volatile data storage circuit is ideally suited for storing a calibration code for calibrating an integrated circuit, and when used in conjunction with such an integrated circuit for calibrating the integrated circuit, no additional terminals are required, since the first terminal used for powering and addressing the data storage circuit during programming can subsequently be used as a power supply terminal for the integrated circuit, and the second terminal can be subsequently used as an input and/or output terminal from the integrated circuit The ground terminal is a common terminal.

The invention will be more dearly understood from the following description of a preferred embodiment thereof, which is given by way of example only, with reference to the accompanying drawings.

DETAILED DESCRIPTION OF THE INVENTION

Figure 1:
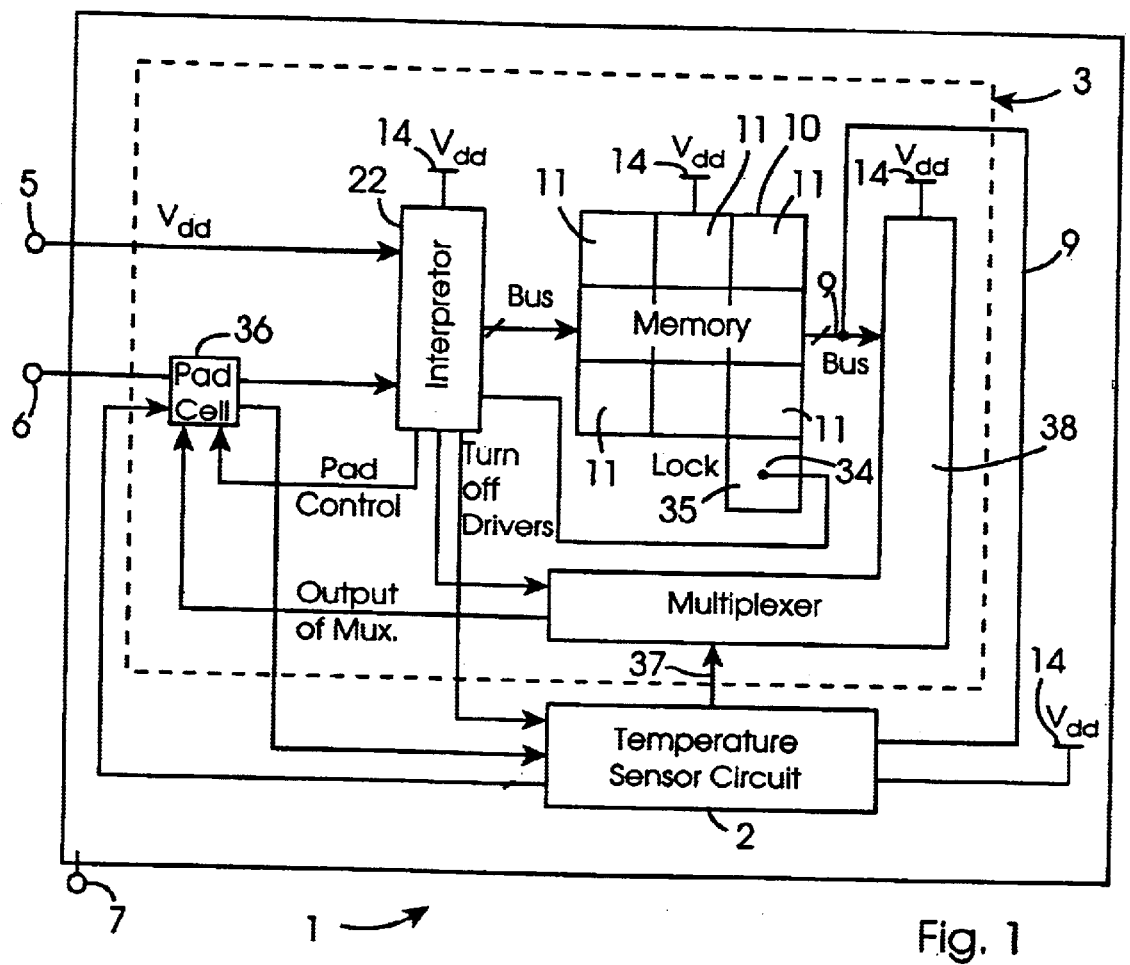
FIG. 1 is a block representation of an integrated circuit according to the invention comprising an on-chip programmable non-volatile data storage circuit, also according to the invention.

Referring to the drawings, there is illustrated an integrated circuit according to the invention indicated generally by the reference numeral 1 which would typically be formed on a single integrated circuit chip. The integrated circuit 1 comprises a primary integrated circuit which may, for example, be a temperature sensor circuit 2 of a temperature sensor, and a calibration circuit 3 provided by a programmable non-volatile data storage circuit also according to the invention for storing a digital calibration code for calibrating the temperature sensor circuit 2. The integrated circuit 1 is provided with three terminals, namely, a first terminal which is a power supply terminal 5 for receiving a power supply $D_{dd}$ for powering the calibration circuit 3 and the temperature sensor circuit 2. A second terminal, namely, an I/O terminal 6 is selectively configurable as an input and/or output terminal to the calibration circuit 3, and also as an input and/or output terminal to the temperature sensor circuit 2 both during and after programming of the calibration circuit 3 has been completed. A ground terminal 7 provides a common ground for both the temperature sensor circuit 2 and the calibration circuit 3.

The calibration circuit 3 comprises a programmable array 10 of addressable first bi-state bi-stable circuit elements 11 which are arranged in a matrix of rows and columns, and which are selectively switchable from a first state to a second state for storing the calibration code. For the purpose of explanation, the array 10 of first circuit elements 11 comprises a three-by-three matrix of first circuit elements 11, however, in practice, many more first circuit elements 11 will be provided in the array 10. The first circuit elements 11 are substantially identical to each other. After calibration has been completed, the calibration code is read from the array 10 on a data bus 9 to the temperature sensor circuit 2 each time the integrated circuit 1 is powered up, and is used for correcting an output signal from the temperature sensor circuit 2, which is indicative of the temperature sensed.

Figure 3:
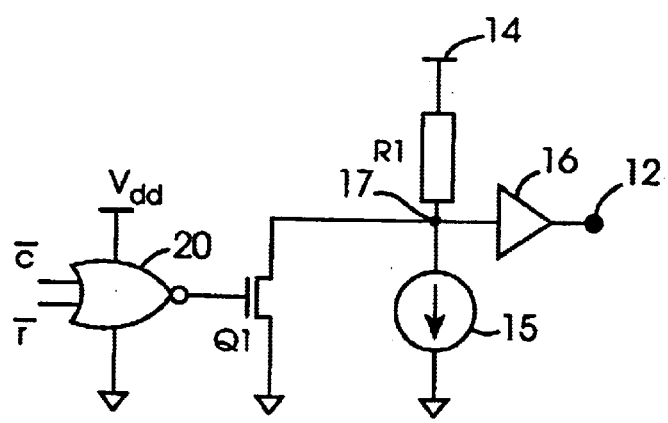
FIG. 3 is a circuit diagram of a part of the programmable non-volatile data storage circuit of FIG. 1.

Before describing the calibration circuit 3 in further detail, one of the first circuit elements 11 will be described with reference to FIG. 3. Each first circuit element 11 is selectively irreversibly electrically switchable from the first state whereby the first circuit element 11 outputs a logic high on an output 12, to the second state whereby the first circuit element 11 outputs a logic low on the output 12. Each first circuit element 11 comprises a blowable fuse which in this embodiment of the invention is provided by a low impedance fuse resistor R1 of approximately 30 ohms. The fuse resistors R1 of the respective first circuit elements 11 are typically formed by gate polysilicon, and are selectively blowable during programming of the calibration circuit 3 from a first closed circuit state with a resistance of approximately 30 ohms which corresponds to the first state of the first circuit elements 11, to a second open circuit state of effectively infinite resistance which corresponds to the second state of the first circuit elements 11. The fuse resistor R1 of each first circuit element 11 is connected between a common source 14 to which the power supply $D_{dd}$ from the power supply terminal 5 is applied and ground through a 5 $\mu$A constant current sink circuit 15. The 5 $\mu$A current of the constant current sink circuit 15 is sufficiently low to avoid blowing of the fuse resistor R1. A buffer 16 buffers the voltage appearing on a node 17 between the fuse resistor R1 and the constant current sink circuit 15 to the output 12 of the first circuit element 11. When the fuse resistor R1 is in its first closed circuit state corresponding to the first state of its first circuit element 11 the voltage on the node 17 is pulled up towards the supply voltage $D_{dd}$ on the common source 14, thereby putting a logic high on the output 12 of the first circuit element 11.

When the fuse resistor R1 has been blown into its second open circuit state corresponding to the second state of the first circuit element 11 the voltage on the node 17 is pulled by the constant current sink circuit 15 to ground thereby applying a logic low on the output 12. A low resistance addressable switch, in this embodiment of the invention a MOSFET Q1 in each first circuit element 11 switches the fuse resistor R1 to ground for applying a current through the fuse resistor R1 for blowing thereof when the MOSFET Q1 is addressed. A NOR gate 20 in each first circuit element 11 is addressable as will be described below for switching the MOSFET Q1 into a conducting state for enabling blowing the fuse resistor R1.

Returning now to the calibration circuit 3, the power supply terminal 5 is adapted for receiving the power supply, the voltage $D_{dd}$ of which is modulated with a serial digital data input signal comprising control commands and address data of the first circuit elements 11, the fuse resistors R1 of which are to be blown for programming the calibration circuit 3 with the calibration code. The power supply voltage $V_{dd}$ is modulated between a maximum value of 6 volts approximately and a minimum value of 5 volts approximately by the data input signal. The I/O terminal 6 is initially configured as an input terminal for receiving a dock signal for clocking the data input signal into an interpreter circuit 22 for interpreting the control commands and the address data in the data input signal, and for selectively and sequentially addressing the first circuit elements 11, the fuse resistors R1 of which are to be blown.

Figure 2:
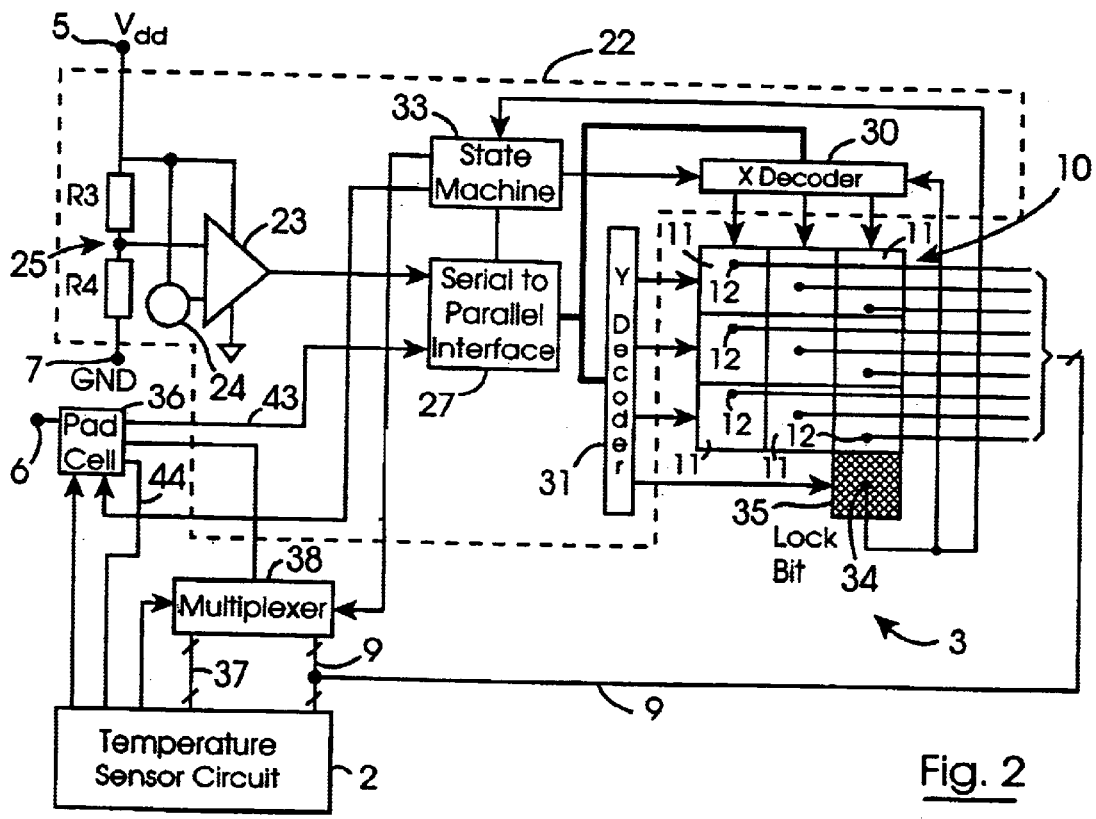
FIG. 2 is a more detailed block representation of the programmable non-volatile data storage circuit.
Figure 4:
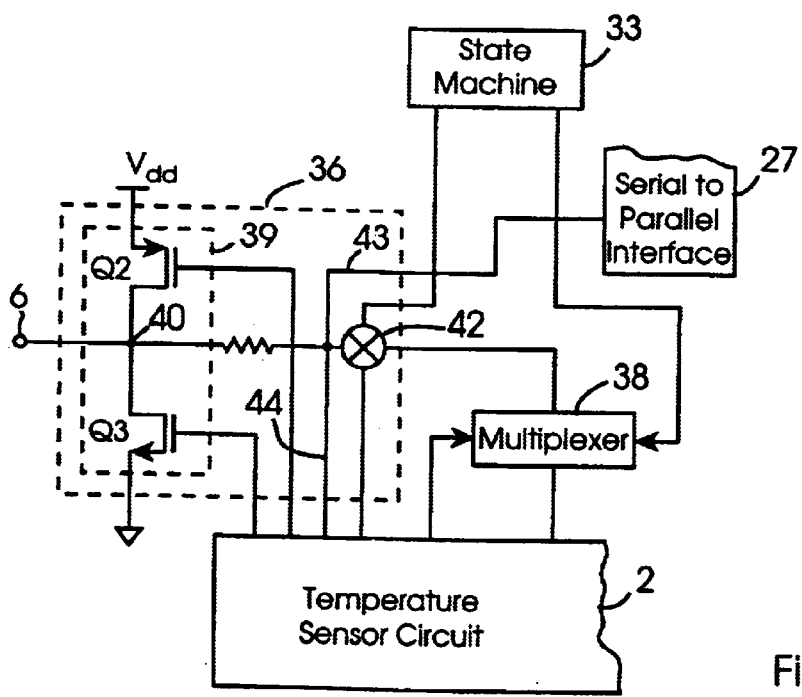
FIG. 4 is a circuit diagram of another part of the programmable non-volatile data storage circuit of FIG. 1.

The interpreter circuit 22 comprises a demodulator provided by a comparator 23, see FIG. 2, for comparing the modulated power supply on the power supply terminal 5 with a reference voltage derived from a reference voltage source 24 for demodulating the signal on the power supply terminal 5. A first input pin of the comparator 23 is connected to the reference voltage source 24, and the modulated power supply on the power supply terminal 5 is applied to a second input pin of the comparator 23 through a potential divider circuit 25 comprising resistors R3 and R4. The resistance values of the resistors R3 and R4 are selected along with the value of the reference voltage, so that as the power supply voltage is modulated by the data input signal between its maximum and minimum values, the divided voltage applied to the second input terminal of the comparator 23 oscillates about the reference voltage, so that the comparator 23 outputs a logic high when the voltage on the second input pin corresponds to the maximum value of the power supply voltage, and a logic low when the voltage on the second input pin corresponds to the minimum voltage of the power supply voltage. The comparator 23 is powered by the power supply on the power supply terminal 5 so that the logic high signal outputted is by the comparator 23 is of voltage substantially similar to the modulated power supply voltage $D_{dd}$, and the logic low is ground.

The comparator 23 outputs the demodulated signal to a serial to parallel data interface circuit 27 of the interpreter circuit 22 which is docked by the clock signal on the I/O terminal 6. An X decoder 30 and a Y decoder 31 decode the parallel data signals from the interface circuit 27 for selectively addressing the first circuit elements 11. A state machine 33 of the interpreter circuit 22 controls the operation of the calibration circuit 3 in response to the data input signal, as will be described below. A single second bi-state bi-stable circuit element 35 is provided and forms a lock bit which disables further programming of the calibration circuit 3 after programming of the calibration circuit 3 has been completed. The second circuit element 35 is addressable by the X and Y decoders 30 and 31, and is similar to the first circuit elements 11, and is irreversibly electrically switchable from a first state to a second state in similar fashion to that by which the first circuit elements are switchable. An output 34 of the second circuit element 35, which is similar to the output 12 from the first circuit elements 11, outputs a logic high when the second circuit element 35 is in the first state and a logic low when the second circuit element 35 is in the second state. The output 34 from the second circuit element 35 is connected to the X decoder 30 and the state machine 33 for permanently disabling the state machine 33 and the X decoder 30 for preventing further switching of the first circuit elements 11 once programming of the calibration circuit 3 has been completed. The state machine 33 and the X decoder 30 are disabled when the output 34 of the second circuit element 35 outputs a logic low.

A pad cell 36 configures the I/O terminal 6 under the control of the state machine 33 in response to the data input signal on the power supply terminal 5 as will be described below, and also in response to the temperature sensor circuit 2 as will also be described below. An analogue multiplexer 38 facilitates reading out of the calibration code stored in the array 10 through the I/O terminal 6, and may also be used for reading out of data from the temperature sensor circuit 2, through the I/O terminal 6. The calibration code stored in the array 10 is outputted on the data bus 9 to the multiplexer 38. Output signals are applied from the temperature sensor circuit 2 to the multiplexer 38 on a data bus 37 where the output signals from the temperature sensor circuit 2 are to be outputted through the multiplexer 38. The multiplexer 38 is operated under the control of the state machine 33 during reading out of data from the array 10 through the I/O terminal 6. Otherwise, control of the multiplexer 38 is passed to the temperature sensor circuit 2.

The pad cell 36 for configuring the I/O terminal 6 comprises an output driver 39 formed by a pair of MOSFETs Q2 and Q3 which are connected in series between the power supply voltage $D_{dd}$ on the power supply terminal 5 and ground. The I/O terminal 6 is connected to a node 40 between the MOSFETs Q2 and Q3, and the MOSFETs Q2 and Q3 are operable under the control of the temperature sensor circuit 2 for driving the voltage on the node 40, and in turn the voltage on the I/O terminal 6 to provide the output signal from the temperature sensor circuit 2, when the I/O terminal 6 is configured as an output terminal operating under the control of the temperature sensor circuit 2. Otherwise, the MOSFETs Q2 and Q3 are switched off and the node 40 floats. The multiplexer 38 is connected to the node 40 through a switch 42 for outputting data from the multiplexer 38 through the I/O terminal 6 when the MOSFETs Q2 and Q3 are switched off and the node 40 is isolated from the supply voltage $V_{dd}$ and ground. The switch 42 is selectively operable under the control of the state machine 33, and is also operable under the control of the temperature sensor circuit 2 when control of the pad cell 36 has been assigned by the state machine 33 to the temperature sensor circuit 2. Lines 43 and 44 from the pad cell 36 deliver signals from the I/O terminal 6 to the interface circuit 27 and to the temperature sensor circuit 2, respectively, when the I/O terminal 6 is configured as an input terminal by the pad cell 36. By outputting the output signals from the temperature sensor circuit 2 through the MOSFETs Q2 and Q3 high drive current capability is provided at any voltage between ground and the power supply voltage $V_{dd}$.

In order to provide a better understanding of the calibration circuit 3, its operation will now be described. Initially the I/O terminal 6 is configured by the pad cell 36 as an input terminal to the calibration circuit 3 for receiving the dock signal, and for applying the dock signal to the interface circuit 27 for clocking the data input signal on the power supply terminal 5. Initially the voltage $V_{dd}$ on the power supply terminal 5 is modulated with a command signal which causes control of the pad cell 36 to be temporarily assigned to the temperature sensor circuit 2 for configuring the I/O terminal 6 as an output terminal through which an analogue voltage signal or a digital signal is outputted from the temperature sensor circuit 2 which is indicative of the temperature of known value being sensed for facilitating a determination of the appropriate calibration code required to be programmed into the calibration circuit 3. Typically, the signal indicative of the temperature sensed is outputted through the multiplexer 38. Although, the signal indicative of the temperature may be outputted under the control of the MOSFETs Q2 and Q3. After the signal indicative of the sensed temperature has been read from the I/O terminal 6, the I/O terminal 6 is reconfigured by the state machine 33 as an input terminal for receiving the clock signals for docking the data input signal on the power supply terminal 5 to the interface circuit 27. The reconfiguration of the I/O terminal 6 by the pad cell 36 as an input terminal to the calibration circuit 3 is achieved by temporarily removing the power supply from the power supply terminal 5 to reset the state machine 33. The pad cell 36 is configured by the state machine 33 or by the temperature sensor circuit 2 on an appropriate command signal from the state machine 33. Once the I/O terminal 6 is reconfigured as an input terminal, the addresses of the first circuit elements, the fuse resistors R1 of which are to be blown are inputted sequentially through the power supply terminal 5 by appropriately modulating the voltage of the power supply to the power supply terminal 5 with the data input signal, which sequentially includes the addresses of the first circuit elements 11 to be selected for blowing of their fuse resistors R1.

The modulated power supply on the power supply terminal 5 is demodulated by the comparator 23, and the data signal is docked to the interface circuit 27 by the clock signal on the I/O terminal 6. The state machine 33 reads the data input signal, and when the address of the first of the first circuit elements 11, the fuse resistor R1 of which is to be blown is received, the Y decoder 31 applies a logic low to an $\bar{r}$ input of the NOR gate 20 of the addressed first circuit element 11. The X address is held in the X decoder 30 until the modulated voltage of the power supply $V_{dd}$ is at its maximum value, at which stage the X decoder 30 is enabled by the state machine 33, and the X decoder 30 applies a logic low on an input $\bar{c}$ of the NOR gate 20 of the addressed first circuit element 11. The logic low on the $\bar{c}$ and $\bar{r}$ inputs of the NOR gate 20 switches the MOSFET Q1 on for connecting the fuse resistor R1 to ground, and thus applying the power supply voltage $V_{dd}$ at its maximum value across the fuse resistor R1. The X decoder 30 is only enabled for blowing the fuse resistor R1 when the power supply on the power supply terminal 5 is at its maximum voltage value for ensuring that the fuse resistor R1 is property blown into the open circuit state. The first circuit elements 11, the fuse resistors R1 of which are to be blown are sequentially addressed until the fuse resistors R1 of the first circuit elements 11 which are to be switched from the first state to the second state have been blown. During blowing of the fuse resistors R1 of the addressed first circuit elements 11 the state machine 33 controls the pad cell 36 for retaining the I/O terminal 6 configured for receiving the clock signal.

When the fuse resistors R1 have been blown of the first circuit elements 11 which are to be switched from the first state to the second state, the state machine in response to an appropriate command in the data input signal operates the pad cell 36 for configuring the I/O terminal 6 as an output terminal so that the status of the first circuit elements 11 can be read out through the multiplexer 38 sequentially through the I/O terminal 6, in other words, so that the stored calibration code can be read out through the I/O terminal 6. This, thus, facilitates checking if the fuse resistors R1 of the first circuit elements 11 to be blown have been adequately blown to an open circuit state. After the status of the first circuit elements 11 has been read through the I/O terminal 6, the power supply to the power supply terminal 5 is modulated with the address of the second circuit element 35 for addressing the second circuit element 35 for blowing the fuse resistor of the second circuit element 35. Blowing of the fuse resistor of the second circuit element 35 switches the second circuit element 35 to its second state, and puts a logic low on the output 34. The logic low on the output 34 of the second circuit element 35 disables the X decoder 30, thus preventing further switching of the first circuit elements 11. The logic low on the output 34 of the second circuit element 35 also disables the state machine 33, thus passing control of the pad cell 36 to the temperature sensor circuit 2. Once the state machine 33 is disabled, further programming of the calibration circuit 3 is permanently prevented, and the integrated circuit 1 is powered through the power supply terminal 5, which is then insensitive to modulation of the power supply voltage.

On control of the pad cell 36 being passed to the temperature sensor circuit 2, the I/O terminal 6 can be configured as an input and/or an output terminal as required under the control of the temperature sensor circuit 2. Although, in general, it is envisaged that in a temperature sensor circuit inputting of data to the temperature sensor circuit would not be a requirement, and thus, the I/O terminal 6 once control of the pad cell 36 has been assigned to the temperature sensor circuit 2 will be configured as an output terminal only. Once the I/O terminal 6 has been configured as an output terminal, the output signal indicative of temperature and/or any other signals from the temperature sensor circuit 2 may be outputted through the multiplexer or by driving the voltage on the node 40 to correspond to the voltage values of the output signals through the MOSFETs Q2 and Q3. How the output signals indicative of temperature and/or any other signals are outputted from the temperature sensor circuit 2 will depend on how the circuit has been programmed. This will be well understood by those skilled in the art. The stored digital calibration code in the calibration circuit 3 is read into the temperature sensor circuit 2 through the data bus 9 each time the integrated circuit 1 is powered up, and is used for correcting the signals indicative of temperature values monitored by the temperature sensor circuit 2 prior to being outputted through the I/O terminal 6.

While the reconfiguration of the I/O terminal 6 for receiving the dock signal after the temperature signal has been initially read out from the temperature sensor circuit 2 by powering down the power supply terminal 5, it is envisaged that in certain cases that reconfiguration of the I/O terminal 6 may be carried out by other suitable means, for example, providing a specific command signal in the data input signal, or by power cycling of the power supply on the power supply terminal 5 between serial data input streams.

While the first circuit elements 11 and the second circuit element 35 have been described as comprising a blowable fuse resistor R1, it is envisaged that other means for switching the circuit elements from a first state to a second state could be provided, and furthermore, it is envisaged that in certain cases the fuse resistors R1 may be replaced by EEPROM cells.

Additionally, while the programmable nonvolatile data storage circuit has been described as being a calibration circuit, the programmable data storage circuit may be used for many other purposes.

While the programmable non-volatile data storage circuit has been described as being a calibration circuit for use in conjunction with a temperature sensor circuit, it will be readily apparent to those skilled in the art that the programmable non-volatile data storage circuit may be used as a calibration circuit in conjunction with any other type of integrated circuit.

It will of course be appreciated that while the calibration circuit has been described as having a three-by-three array of first circuit elements, in a practical implementation of the programmable data storage circuit, the array will comprise many more first circuit elements, typically, of the order of thirty to forty first circuit elements where the calibration circuit is to be provided in conjunction with a temperature sensor circuit, and of the order of up to one hundred first circuit elements, where the calibration circuit is to be used in conjunction with, for example, a high speed DAC or the like.

What is claimed is:

1. A programmable non-volatile data storage circuit comprising:
   a plurality of selectively addressable first bi-state bi-stable circuit elements, the first circuit elements being electrically switchable from a first state to a second state for programming the storage circuit,
   a first terminal for receiving a power supply modulated with one of a serial data input signal with address data of selected ones of the first circuit elements to be switched from the first state to the second state, and a dock signal for clocking the data input signal,
   a selectively configurable second terminal for receiving the other of the serial data input signal and the dock signal, and
   an interpreter circuit responsive to the data input signal and the clock signal for selecting and addressing each first circuit element to be switched in response to the data input signal, and for enabling switching of each of the selected first circuit elements, and for selectively configuring the second terminal as an input and/or output terminal to operate under the control of a primary circuit with which the data storage circuit is associated, in response to the data input signal.

2. A data storage circuit as claimed in claim 1 in which the voltage of the power supply on the first terminal is modulated by the one of the serial data input signal and the clock signal.

3. A data storage circuit as claimed in claim 2 in which the interpreter circuit enables switching of each selected first circuit element when the voltage of the modulated power supply on the first terminal is at a maximum value.

4. A data storage circuit as claimed in claim 2 in which the interpreter circuit comprises a demodulator for demodulating the modulated voltage of the power supply on the first terminal and for providing the one of the serial data input signal and the dock signal.

5. A data storage circuit as claimed in claim 4 in which the demodulator comprises a comparator for comparing the voltage of the modulated power supply on the first terminal with a reference voltage, and for outputting the one of the serial data input signal and the dock signal.

6. A data storage circuit as claimed in claim 5 in which the reference voltage is selected to lie within the maximum and minimum voltage values of the modulated power supply applied to the comparator.

7. A data storage circuit as claimed in claim 5 in which the comparator outputs one of a high and low signal in response to the voltage of the modulated power supply applied to the comparator being above the reference voltage, and the comparator outputs the other of the high and low signal in response to the voltage of the modulated power supply applied to the comparator being below the reference voltage.

8. A data storage circuit as claimed in claim 5 in which the modulated power supply is applied to the comparator through a potential divider.

9. A data storage circuit as claimed in claim 2 in which the interpreter circuit comprises a state machine for enabling switching of each first circuit element to be switched when the voltage of the modulated power supply is at its maximum value.

10. A data storage circuit as claimed in claim 9 in which the modulated power supply is applied to each first circuit element when switching of that first circuit element is enabled.

11. A data storage circuit as claimed in claim 9 in which the interpreter circuit comprises a serial to parallel data interface circuit for converting the serial data input signal to a parallel data signal.

12. A data storage circuit as claimed in claim 9 in which the first circuit elements are arranged in a matrix comprising a plurality of rows and columns of first circuit elements, and the interpreter circuit comprises an X decoder and a Y decoder for decoding the data signal for selectively addressing each first circuit element by its row and column location, one of the X decoder and the Y decoder being enabled by the state machine for enabling switching of each first circuit element when it is addressed.

13. A data storage circuit as claimed in claim 1 in which the second terminal is initially configured as an input terminal for receiving the one of the serial data input signal and the clock signal.

14. A data storage circuit as claimed in claim 1 in which the second terminal is configurable by the interpreter circuit in response to the data input signal for facilitating reading the status of each first circuit element.

15. A data storage circuit as claimed in claim 1 in which the second terminal is configurable as an output terminal for outputting a signal from the primary circuit prior to switching of the first circuit elements.

16. A data storage circuit as claimed in claim 15 in which the second terminal is reconfigurable as an input terminal for receiving the one of the serial data input signal and the dock signal until completion of switching of the first circuit elements to be switched in response to the data input signal.

17. A data storage circuit as claimed in claim 16 in which the second terminal is reconfigurable as an input terminal for receiving the one of the serial data input signal and the clock signal in response to temporary removal of the power supply from the first terminal.

18. A data storage circuit as claimed in claim 1 in which the second terminal is configurable by the interpreter circuit to be operable under the control of the primary circuit in response to switching of the first circuit elements to be switched being completed.

19. A data storage circuit as claimed in claim 1 in which a second bi-state bi-stable circuit element is provided, the second circuit element being electrically switchable from a first state to a second state for preventing further switching of the first circuit elements, the second circuit element being selectable and addressable by the interpreter circuit in response to the data input signal for switching from the first state to the second state.

20. A data storage circuit as claimed in claim 19 in which the second circuit element comprises a blowable fuse having a relatively low impedance in a conducting state corresponding to the first state, and a relatively high impedance in a non-conducting state when blown into an open circuit state corresponding to the second state.

21. A data storage circuit as claimed in claim 20 in which an addressable switch is provided in the second circuit element, the switch being selectively addressable and being enabled by the interpreter circuit in response to the data input signal for applying the power supply to the fuse for blowing thereof.

22. A data storage circuit as claimed in claim 19 in which the interpreter circuit is non-responsive to modulation of the power supply on the first terminal after the second circuit element has been switched from the first state to the second state.

23. A data storage circuit as claimed in claim 19 in which the second circuit element is irreversibly electrically switchable from the first state to the second state.

24. A data storage circuit as claimed in claim 1 in which each first circuit element comprises a blowable fuse having a relatively low impedance in a conducting state corresponding to the first state, and a relatively high impedance in a non-conducting state when blown into an open circuit state corresponding to the second state.

25. A data storage circuit as claimed in claim 24 in which an addressable switch is provided in each first circuit element, the switch of each first circuit element being selectively addressable and being enabled by the interpreter circuit in response to the data input signal for applying the power supply to the fuse for blowing thereof.

26. A data storage circuit as claimed in claim 1 in which each first circuit element is irreversibly electrically switchable from the first state to the second state.

27. A data storage circuit as claimed in claim 1 in which the first circuit elements are sequentially selectable for switching by the interpreter circuit.

28. A data storage circuit as claimed in claim 1 in which the first terminal is adapted for receiving the power supply modulated with the serial data input signal, and the second terminal is adapted for receiving the clock signal for clocking the data input signal to the interpreter circuit.

29. An integrated circuit comprising a primary circuit, and the programmable non-volatile data storage circuit as claimed in claim 1 for storing a calibration code for the primary circuit, the first terminal providing the power supply to the primary circuit, and the second terminal being selectively configurable to be operable under the control of the primary circuit in response to the data input signal.

30. A method for operating an integrated circuit comprising a primary circuit, and the programmable non-volatile data storage circuit as claimed in claim 1 for storing a calibration code for the primary circuit, the method comprising the steps of calibrating the primary circuit by storing a calibration code in the data storage circuit, the calibration code being stored in the data storage circuit by modulating the power supply to the first terminal with one of a serial data input signal with address data of selective ones of the first circuit elements to be switched from the first state to the second state in order to store the calibration code, and a dock signal for docking the data input signal, and applying the other of the serial data input signal and the dock signal to the second terminal of the data storage circuit, reading the data input signal, selecting and addressing the first circuit elements to be switched from the first state to the second state and enabling switching of the addressed first circuit elements, configuring the second terminal in response to the data input signal as an input and/or output terminal operable under the control of the primary circuit, and powering the primary circuit through the first terminal.

31. A method as claimed in claim 30 in which the second terminal is configured as an input and/or output terminal operable under the control of the primary circuit in response to storage of the calibration code in the data storage circuit having been completed.

32. A method for programming a non-volatile data storage circuit comprising a plurality of selectively addressable first bi-state bi-stable circuit elements, the first circuit elements being electrically switchable from a first state to a second state for programming the data storage circuit, the method comprising the steps of:

applying a power supply to the data storage circuit through a first terminal thereof, and modulating the power supply with one of a serial data input signal with address data of selected ones of the first circuit elements to be switched from the first state to the second state, and a cock signal for docking the data input signal, applying the other of the serial data input signal and the cock signal to a selectively configurable second terminal thereof, reading the data input signal, selecting and addressing each circuit element to be switched in response to the data input signal and enabling switching of each selected circuit element, and selectively configuring the second terminal in response to the data input signal as an input and/or output terminal to operate under the control of a primary circuit with which the data storage circuit is associated.

33. A method as claimed in claim 32 in which the voltage of the power supply on the first terminal is modulated by the one of the serial data input signal and the dock signal.

34. A method as claimed in claim 33 in which switching of each selected first circuit element is enabled when the voltage of the modulated power supply on the first terminal is at a maximum value.

35. A method as claimed in claim 33 in which the voltage of the power supply on the first terminal is demodulated for providing the one of the serial data input signal and the clock signal.

36. A method as claimed in claim 35 in which the power supply is demodulated by a comparator which compares the voltage of the modulated power supply on the first terminal with a reference voltage, and outputs the one of the serial data input signal and the clock signal.

37. A method as claimed in claim 36 in which the reference voltage is selected to lie within the maximum and minimum voltage values of the modulated power supply applied to the comparator.

38. A method as claimed in claim 36 in which the comparator outputs one of a high or low signal in response to the voltage of the modulated power supply applied to the comparator being above the reference voltage, and the comparator outputs the other of the high and low signal in response to the voltage of the modulated power supply applied to the comparator being below the reference voltage.

39. A method as claimed in claim 32 in which the modulated power supply is applied to each first circuit element when switching of that first circuit element is enabled.

40. A method as claimed in claim 32 in which the second terminal is initially configured as an input terminal for receiving the one of the serial data input signal and the clock signal.

41. A method as claimed in claim 32 in which the second terminal is configurable in response to the data input signal for facilitating reading the status of each first circuit element.

42. A method as claimed in claim 32 in which the second terminal is configurable as an output terminal for outputting a signal from the primary circuit prior to switching of the first circuit elements.

43. A method as claimed in claim 42 in which the second terminal is reconfigurable as an input terminal for receiving the one of the serial data input signal and the dock signal until completion of switching of the first circuit elements to be switched in response to the data input signal.

44. A method as claimed in claim 43 in which the second terminal is reconfigurable as an input terminal for receiving the one of the serial data input signal and the dock signal in response to temporary removal of the power supply from the first terminal.

45. A method as claimed in claim 32 in which the second terminal is configurable to be operable under the control of the primary circuit in response to switching of the first circuit elements to be switched being completed.

46. A method as claimed in claim 32 in which the data storage circuit comprises a second bi-state bi-stable circuit element, the second circuit element being electrically switchable from a first state to a second state for preventing further switching of the first circuit elements, and the method comprises the step of selectively addressing the second circuit element in response to the data input signal for switching the second circuit element from the first state to the second state.

47. A method as claimed in claim 46 in which the data storage circuit is non-responsive to modulation of the power supply on the first terminal after the second circuit element has been switched from the first state to the second state.

48. A method as claimed in claim 46 in which the second circuit element is irreversibly electrically switchable from the first state to the second state.

49. A method as claimed in claim 32 in which each first circuit element is irreversibly electrically switchable from the first state to the second state.

50. A method as claimed in claim 32 in which the first circuit elements are sequentially switched from the first state to the second state.

51. A method as claimed in claim 32 in which the power supply on the first terminal is modulated with the serial data input signal, and the clock signal is applied to the second terminal.

* * * * *

UNITED STATES PATENT AND TRADEMARK OFFICE
CERTIFICATE OF CORRECTION

PATENT NO.     : 6,678,185 B1
DATED          : January 13, 2004
INVENTOR(S)    : John Anthony Cleary It is certified that error appears in the above-identified patent and that said Letters Patent is hereby corrected as shown below:

Column 1,
Line 14, should read -- storage circuit, and additionally the invention relates to an --
Line 17, should read -- calibration code for the primary circuit of the integrated --
Line 22, should read -- integrated circuit chip for calibrating the integrated circuit. --
Line 29, should read -- to a second state for programming the calibration circuit. In --
Line 33, should read -- calibration circuit. Such bi-state bi-stable circuit elements --
Line 36, should read -- in its closed circuit state and is of relatively low impedance. --
Line 60, should read -- trimming method permits trimming to be carried out at the --

Column 2,
Line 48, should read -- Preferably, the voltage of the power supply on the first --
Line 50, should read -- signal and the clock signal. --
Line 57, should read -- voltage of the power supply on the first terminal and for --

Column 3,
Line 42, should read -- the one of the serial data input signal and the clock signal --

Column 4,
Line 18, should read -- is provided in each first circuit element, the switch of each --
Line 54, should read -- state, and a clock signal for clocking the data input --

Column 5,
Line 12, should read -- signal, and the clock signal is applied to the second terminal. --
Line 24, should read -- store the calibration code, and a clock signal for clocking the --
Line 26, should read -- input signal and the clock signal to the second terminal of the --
Line 33, should read -- primary circuit, and powering the primary circuit through the --
Line 52, should read -- clock signal, and a ground terminal. A particularly advanta- --
Line 66, should read -- from the integrated circuit. The ground terminal is a common --

Column 6,
Line 1, should read -- The invention will be more clearly understood from the --
Line 26, should read -- prises a primary integrated circuit, which may, for example, --
Line 34, should read -- $V_{dd}$ for powering the calibration circuit 3 and the tempera- --

UNITED STATES PATENT AND TRADEMARK OFFICE
CERTIFICATE OF CORRECTION

PATENT NO. : 6,678,185 B1
DATED : January 13, 2004
INVENTOR(S) : John Anthony Cleary It is certified that error appears in the above-identified patent and that said Letters Patent is hereby corrected as shown below:

Column 7,
Line 4, should read -- from a first closed circuit state with a resistance of approxi- --
Line 10, should read -- common source 14 to which the power supply $V_{dd}$ from the --
Line 18, should read -- its first closed circuit state corresponding to the first state of --
Line 20, should read -- pulled up towards the supply voltage $V_{dd}$ on the common --
Line 38, should read -- the voltage $V_{dd}$ of which is modulated with a serial digital --
Line 46, should read -- configured as an input terminal for receiving a clock signal --

Column 8,
Line 7, should read -- logic high signal outputted by the comparator 23 of --
Line 9, should read -- voltage $V_{dd}$, and the logic low is ground. --
Line 12, should read -- circuit 22 which is clocked by the clock signal on the I/O --
Line 60, should read -- supply voltage $V_{dd}$ on the power supply terminal 5 and --

Column 9,
Line 23, should read -- terminal to the calibration circuit 3 for receiving the clock --
Line 24, should read -- signal, and for applying the clock signal to the interface --
Line 42, should read -- an input terminal for receiving the clock signals for clocking --
Line 61, should read -- signal is clocked to the interface circuit 27 by the clock signal --

Column 10,
Line 12, should read -- ensuring that the fuse resistor R1 is properly blown into the --

Column 11,
Line 10, should read -- ing the clock signal after the temperature signal has been --
Line 25, should read -- Additionally, while the programmable non-volatile data --
Line 59, should read -- clock signal for clocking the data input signal, --
Line 61, should read -- the other of the serial data input signal and the clock --

Column 12,
Line 16, should read -- signal and the clock signal. --
Line 21, should read -- serial data input signal and the clock signal. --

Column 13,
Line 5, should read -- receiving the one of the serial data input signal and the clock --

UNITED STATES PATENT AND TRADEMARK OFFICE
CERTIFICATE OF CORRECTION

PATENT NO. : 6,678,185 B1
DATED : January 13, 2004
INVENTOR(S) : John Anthony Cleary It is certified that error appears in the above-identified patent and that said Letters Patent is hereby corrected as shown below:

Column 14,
Line 18, should read -- second state in order to store the calibration code, and a clock --
Line 19, should read -- signal for clocking the data input signal, and applying the --
Line 20, should read -- other of the serial data input signal and the clock signal to the --
Line 43, should read -- state, and a clock signal for clocking the data input --
Line 46, should read -- clock signal to a selectively configurable second termi- --
Line 59, should read -- one of the serial data input signal and the clock signal. --

Column 15,
Line 34, should read -- the one of the serial data input signal and the clock signal --

Column 16,
Line 3, should read -- the one of the serial data input signal and the clock signal in --

Signed and Sealed this

Twenty-sixth Day of July, 2005

JON W. DUDAS
*Director of the United States Patent and Trademark Office*